(12) United States Patent
Hosono et al.

(10) Patent No.: US 8,493,770 B2
(45) Date of Patent: Jul. 23, 2013

(54) NON-VOLATILE SEMICONDUCTOR STORAGE DEVICE WITH CONCURRENT READ OPERATION

(75) Inventors: Koji Hosono, Fujisawa (JP); Yuri Terada, Yokohama (JP); Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 453 days.

(21) Appl. No.: 12/884,965

(22) Filed: Sep. 17, 2010

(65) Prior Publication Data

US 2011/0066878 A1 Mar. 17, 2011

(30) Foreign Application Priority Data

Sep. 17, 2009 (JP) .................... 2009-216095
Sep. 14, 2010 (JP) .................... 2010-206059

(51) Int. Cl.
*G11C 11/00* (2006.01)
(52) U.S. Cl.
USPC .................. 365/148; 365/189.04; 365/220
(58) Field of Classification Search
USPC ............. 365/80–93, 148, 158, 163, 171, 173, 365/189.04, 220
See application file for complete search history.

(56) References Cited

U.S. PATENT DOCUMENTS

| 6,462,985 | B2 | 10/2002 | Hosono et al. |
| 7,251,190 | B2 | 7/2007 | Imamiya et al. |
| 7,755,934 | B2 * | 7/2010 | Toda et al. .................... 365/163 |
| 2007/0285971 | A1 * | 12/2007 | Toda et al. .................... 365/148 |
| 2010/0214820 | A1 | 8/2010 | Hosono et al. |
| 2011/0066878 | A1 | 3/2011 | Hosono et al. |
| 2011/0235394 | A1 | 9/2011 | Sasaki et al. |

FOREIGN PATENT DOCUMENTS

| JP | 2002-541613 | 12/2002 |
| JP | 2009-064498 | 3/2009 |

OTHER PUBLICATIONS

Office Action mailed Apr. 30, 2013 in Japanese Application No. 2010-206059 filed Sep. 14, 2010 (w/English translation).

* cited by examiner

*Primary Examiner* — Alexander Sofocleous
*Assistant Examiner* — Lance Reidlinger
(74) *Attorney, Agent, or Firm* — Oblon, Spivak, McClelland, Maier & Neustadt, L.L.P.

(57) ABSTRACT

A semiconductor storage device includes a memory cell array including memory cells arranged at respective intersections between first wirings and second wirings. Each of the memory cells includes a rectifier element and a variable resistance element connected in series. A control circuit is configured to apply a first voltage to a selected first wiring and a second voltage lower than the first voltage to a selected second wiring so that a certain potential difference is applied to a selected memory cell positioned at an intersection between the selected first wiring and the selected second wiring. The control circuit performs a concurrent read operation to perform a read operation from plural memory cells concurrently by applying the first voltage to a plurality of the first wirings concurrently. It is possible to switch the number of the first wirings to be applied with the first voltage concurrently in the concurrent read operation.

19 Claims, 9 Drawing Sheets

NON-VOLATILE SEMICONDUCTOR STORAGE DEVICE WITH CONCURRENT READ OPERATION

CROSS REFERENCE TO RELATED APPLICATIONS

This application is based on and claims the benefit of priority from prior Japanese Patent Application No. 2009-216095, filed on Sep. 17, 2009, and prior Japanese Patent Application No. 2010-206059, filed on Sep. 14, 2010, the entire contents of which are incorporated herein by reference.

BACKGROUND

1. Field

Embodiments described herein relate generally to a non-volatile semiconductor storage device.

2. Description of the Related Art

Resistive memory devices that use variable resistance elements as storage elements have attracted increased attention as a likely candidate for replacing flash memory. As described herein, it is assumed that the resistive memory devices include Resistive RAM (ReRAM) in a narrow sense that uses a transition metal oxide as a memory layer and stores its resistance states in a non-volatile manner, as well as Phase Change RAM (PCRAM) that uses chalcogenide or the like as a memory layer to utilize the resistance information of crystalline states (conductors) and amorphous states (insulators), and so on.

It is known that the memory cells in resistive memory devices have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner.

For unipolar-type ReRAM, data is written to a memory cell by applying a certain voltage to a variable resistance element for a short period of time. As a result, the variable resistance element changes from a high resistance state to a low resistance state. The operation of changing a variable resistance element from a high resistance state to a low resistance state is hereinafter referred to as the "set operation".

On the other hand, data is erased from a memory cell by applying a certain voltage for a long period of time that is lower than the voltage applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation". For example, a memory cell takes a high resistance state as a stable state (reset state), and, for binary storage, data is written to the memory cell by a set operation that causes a reset state to be switched to a low resistance state.

In addition, a read operation from a memory cell is performed by applying a certain voltage to a variable resistance element and monitoring at a sense amplifier circuit the current flowing through the variable resistance element (specifically, detecting a change in voltage of a bit line).

In such resistive memory devices, it is required to read as many memory cells as possible concurrently for improved reading speed. In this case, however, erroneous read may occur. As such, it is difficult to improve reading speed and reduce the likelihood of erroneous read at the same time.

DETAILED DESCRIPTION

A semiconductor storage device according to an embodiment includes a memory cell array including memory cells arranged at respective intersections between a plurality of first wirings and a plurality of second wirings, each of the memory cells including a rectifier element and a variable resistance element connected in series. A control circuit is configured to apply a first voltage to a selected one of the first wirings and a second voltage lower than that of the first voltage to a selected one of the second wirings so that a certain potential difference is applied to a selected memory cell positioned at an intersection between the selected first wiring and the selected second wiring.

The control circuit is configured to be able to perform a concurrent read operation to perform a read operation from a plurality of the memory cells concurrently by applying the first voltage to a plurality of the first wirings concurrently. It is possible to switch the number of the first wirings to be applied with the first voltage concurrently in the concurrent read operation.

Embodiments will now be described below with reference to the accompanying drawings.

[First Embodiment]

(Configuration of Semiconductor Storage Device in First Embodiment)

Figure 1:
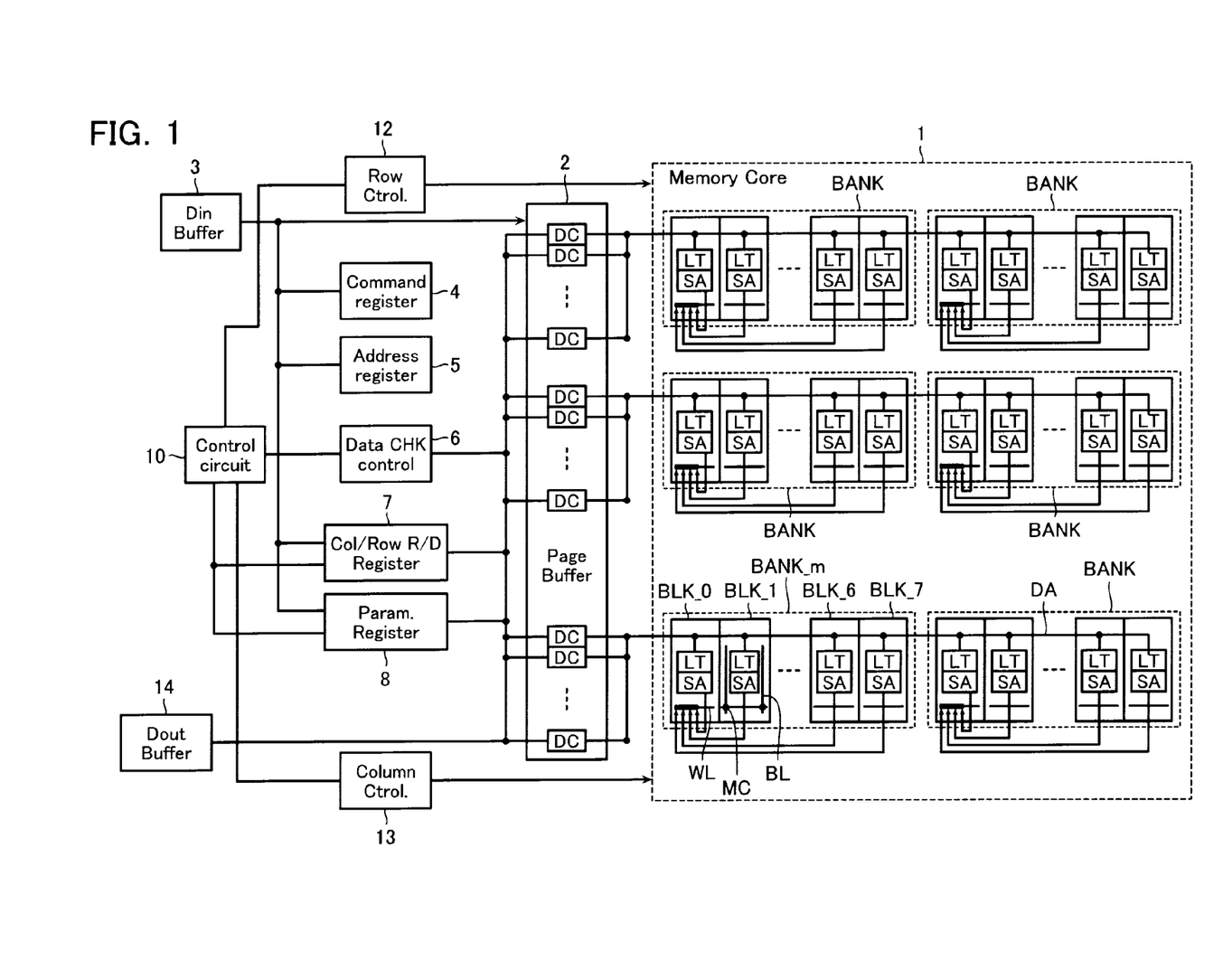
FIG. 1 is a block diagram illustrating an example of the entire configuration of a semiconductor storage device according to a first embodiment.
Figure 2:
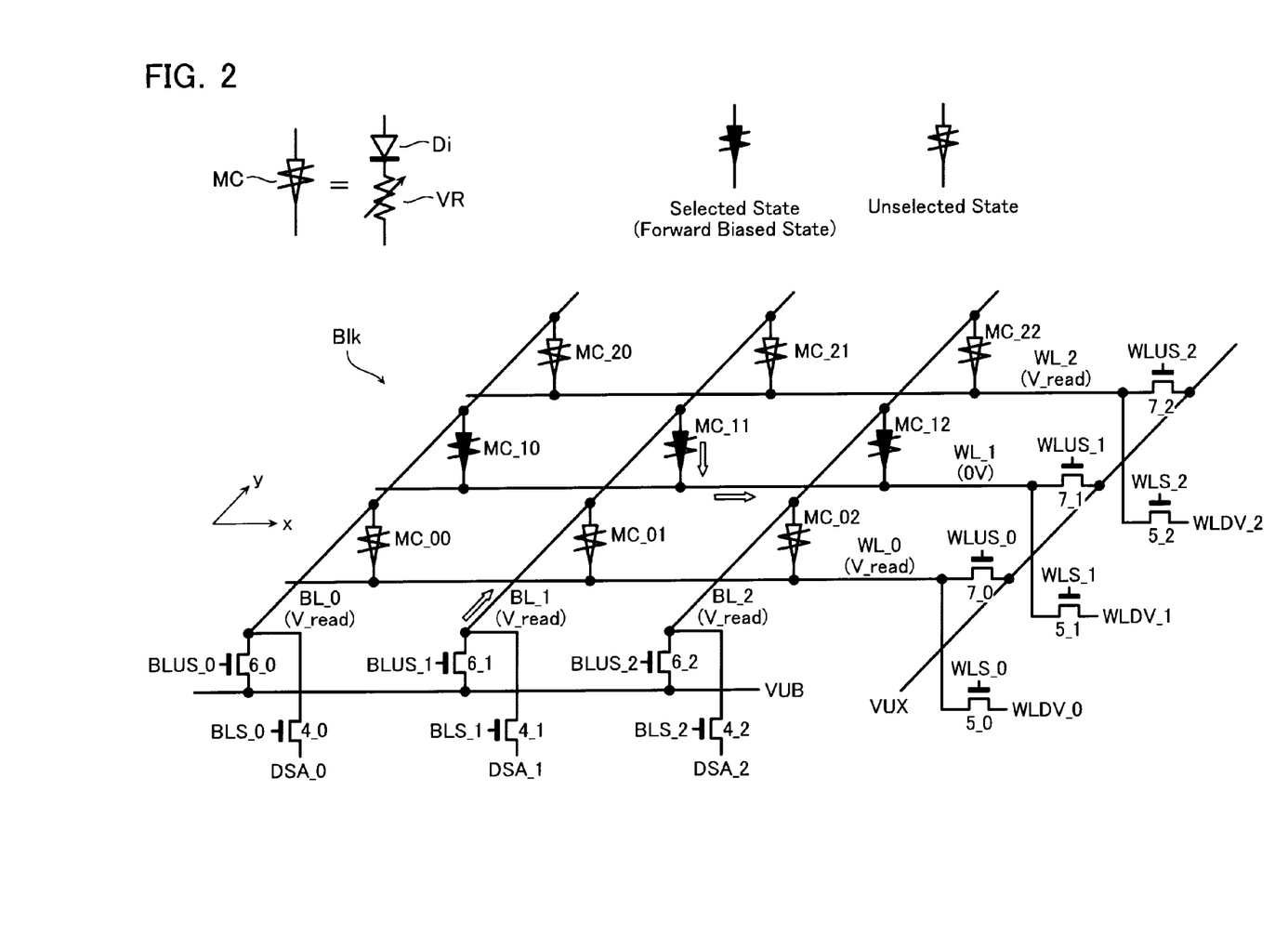
FIG. 2 illustrates an example of a part of the layout of one memory block BLK in FIG. 1.

FIG. 1 is a block diagram illustrating an example of the entire configuration of a semiconductor storage device according to a first embodiment. FIG. 2 illustrates an example of a part of the layout of one memory block BLK in FIG. 1.

The semiconductor storage device according to the first embodiment comprises a memory core 1 including a plurality of memory cells MC. The memory core 1 includes a plurality of (e.g., 32) memory banks BANK arranged therein. Each memory bank BANK includes a plurality of (e.g., 8) memory blocks BLK. A plurality of (e.g., 2048) bit lines BL and a plurality of (e.g., 512) word lines WL are arranged to intersect each other in each memory block BLK. Memory cells MC are arranged at respective intersections between the bit lines and the word lines. The memory cells MC are resistive memory elements as described below.

As illustrated in FIG. 1, each memory bank BANK is provided with a latch circuit LT and a sense amplifier circuit SA. The latch circuit LT acts as a data retaining circuit for temporarily retaining the write data supplied from the outside and for temporarily retaining the data read from the sense amplifier circuit SA. The latch circuit LT is connected to a data line DA. The sense amplifier circuit SA is connected to one bit line BL via a column gate not illustrated. The sense amplifier circuit has functions for sensing/amplifying a cell signal that is output from a memory cell MC to the bit line BL, and for supplying the amplified signal to the data line DA.

While a plurality of bit lines BL are arranged in one memory block BLK in each memory bank BANK, each memory block BLK is provided with only one set of a latch circuit LT and a sense amplifier circuit SA. Thus, eight sets of latch circuits LT and sense amplifier circuits SA in each memory bank BANK are shared between eight memory blocks BLK. That is, if one column (eight bit lines BL) is selected in one block BLK in each memory bank BANK, then these eight latch circuits LT or sense amplifier circuits SA are connected to the bit lines BL of the one column via a column gate not illustrated. Providing such 32 memory banks BANK enables concurrent data accessing function of 32×8 bits=32 bytes of data into a sense amplifier circuit SA at a time.

This semiconductor storage device also comprises a page buffer 2 as a circuit for storing read data corresponding to the amplified signal output from a sense amplifier circuit SA to the data line DA. The page buffer 2 comprises a number of data latch circuits DC, which number corresponds to a page length defined by the semiconductor storage device, e.g., 2 Kbytes.

In a normal data read operation, once a read execution command is input, a read signal is output from the selected one column to a sense amplifier circuit SA, which in turn senses and amplifies the read signal. Then, while a busy signal is being output, the sense amplifier circuit SA transfers data via the latch circuit LT over the data line DA to the page buffer 2. If the number of sense amplifier circuits SA present in the memory core 1 is less than the page length in the page buffer 2, then the above-mentioned read operation is repeated multiple times. Once the page buffer 2 is filed with one page of data or a certain amount of data after the repetition of the read operation multiple times, the page buffer 2 can output data to the outside.

In a data write operation, one page of data is stored in the page buffer 2 in response to the input of a data load command. Then, once a write execution command is input, a busy signal is output. In addition, the data stored in the page buffer 2 are transferred to the latch circuit LT by a certain unit, and keep being written to a selected cell. Note that the data transfer from the page buffer 2 to a respective memory bank BANK is performed in multiple cycles.

This semiconductor storage device also comprises an input data buffer 3, a command register 4, an address register 5, a data check control circuit 6, a column/row redundancy register 7, a parameter register 8, a controller 10, a row control circuit 12, a column control circuit 13, and an output data buffer 14.

The input data buffer 3 has a function for temporarily retaining the write data supplied from the outside before transferring it to the page buffer 2. The output data buffer 14 has a function for temporarily retaining the data read via the page buffer 2 before outputting it to the outside. The command register 4 has a function for temporarily retaining the command supplied from the outside. The address register 5 has a function for temporarily retaining the address data supplied from the outside.

The data check control circuit 6 has a function for checking whether or not the data read from the outside has any error based on an ECC code, and so on. Note that an ECC code may be written to a memory cell together with write data at the time of data write, or may be stored in other peripheral circuits.

The column/row redundancy register 7 has a function for storing information, such as addresses of any defective memory cell in the memory core 1 and of the replacing memory cell. The parameter register 8 has a function for storing the initial setting data (ROM fuse data) read from the memory core 1. The controller 10 governs the entire control of the device. The row control circuit 12 selectively drives a word line WL in the memory core 1 according to a row address signal, and supplies voltages required for various operations. The column control circuit 13 selects any one of the columns in a memory block according to a column address signal, and supplies voltages required for various operations to the bit lines BL in that one column.

Referring now to FIG. 2, a specific configuration of each memory block will be described below. As illustrated in FIG. 2, the unipolar-type resistive memory device has memory blocks BLK, each of which includes resistive-type unit memory cells MC that are positioned at respective intersections between bit lines BL and word lines WL intersecting each other. Each of the resistive-type unit memory cells MC includes a rectifier element, e.g., a diode Di, and a variable resistance element VR connected in series. It is assumed herein that a signal line connected to the anode side of a diode Di represents a bit line BL and another connected to the cathode side represents a word line WL. In addition, each memory cell MC including a diode Di and a variable resistance element VR connected in series is denoted by a symbol as illustrated in FIG. 2. This also applies to the following examples. It should be appreciated that a diode Di and a variable resistance element VR included in a memory cell MC are not limited to the arrangement or polarity as illustrated in the figure.

In the memory block BLK of FIG. 2, bit lines BL are arranged along the y direction of FIG. 2 as its longitudinal direction, while word lines WL are arranged along the x direction of FIG. 2 as its longitudinal direction. Then, unit memory cells MC are positioned at respective intersections between these bit lines BL and word lines WL, and are arranged in a two-dimensional matrix form. For simplicity, FIG. 2 only illustrate three bit lines BL and three word lines WL. However, an actual memory block BLK may include, for example, 2048 bit lines BL and 512 word lines WL arranged therein, for a total of 1 Mbits of memory cells MC.

The variable resistance elements VR have a structure of, e.g., electrode/transition metal oxide/electrode. The variable resistance elements VR provide a change in resistance value of a metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state as with chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence or presence of electric charges trapped by a charge trap residing on an electrode interface; and the other is the type where a resistance change occurs depending on the absence or presence of a conducting path due to oxygen defect, etc.); and so on.

For unipolar-type ReRAM, data is written to a memory cell MC by applying to a variable resistance element VR a voltage of, e.g., 3.5 V (on the order of 4.5 V across the bit line BL and the word line WL if a voltage drop in the diode Di is added) and a current of on the order of 10 nA for on the order of 10 ns to 100 ns. As a result, the variable resistance element VR changes from a high resistance state to a low resistance state (set operation).

On the other hand, data is erased from a memory cell MC by applying to a variable resistance element VR, which is in its low resistance state after the set operation, a voltage of 0.8 V (on the order of 1.8 V across the bit line BL and the word line WL if a voltage drop in the diode Di is added) and a current of on the order of 1 µA to 10 µA for on the order of 500 ns to 2 µs. As a result, the variable resistance element VR changes from a low resistance state to a high resistance state (reset operation).

A read operation from a memory cell MC is performed by providing a variable resistance element VR with a read voltage of on the order of 0.4 V, and monitoring at the sense amplifier circuit a current flowing through the variable resistance element VR. As a result, it is determined whether the variable resistance element VR is in its low resistance or high resistance state. FIG. 2 illustrates a case where a plurality of memory cells MC_10, MC_11, and MC_12 along one word line WL_1 are read concurrently. In this case, a read voltage V_read is applied to all of the bit lines BL_0, BL_1, and BL_2. For the word lines WL, a selected word line WL_1 is only set at 0 V, and the read voltage V_read is applied to the other word lines WL_0 and WL_2. Wherein the read voltage V_read is set to on the order of 1.4 V in consideration of a voltage drop in the diode Di.

NMOS transistors 4 (4_0 to 4_2) and NMOS transistors 6 (6_0 to 6_2) are connected to bit lines BL_0 to BL_2, respectively, in the memory block BLK as illustrated in FIG. 2. The bit lines BL_0 to BL_2 are selected by the transistors 4 and 6, and controlled to be at a potential required for a desired operation. The transistors 4_0 to 4_2 are connected to signal lines DSA_0 to DSA_2, and controlled by signals BLS_0 to BLS_2 input to the gates thereof, respectively. In addition, the transistors 6_0 to 6_2 are connected to a signal line VUB, and controlled by signals BLUS_0 to BLUS_2 input to the gates thereof.

The signal lines DSA_0 to DSA_2 are connected to the sense amplifier circuit SA and the latch circuit LT directly or through a certain select switch. When a bit line is selected, a voltage required for a desired operation is applied to the signal lines DSA_0 to DSA_2. The signal line VUB is a signal line for providing a potential (e.g., 0 V) that is applied when a bit line is unselected.

Similarly, NMOS transistors 5 (5_0 to 5_2) and NMOS transistors 7 (7_0 to 7_2) are connected to word lines WL_0 to WL_2, respectively. The word lines WL_0 to WL_2 are selected by the transistors 5 and 7 to control the potential of the word lines WL_0 to WL_2. The transistors 5_0 to 5_2 are connected to signal lines WLDV_0 to WLDV_2, and controlled by signals WLS_0 to WLS_2 input to the gates thereof. In addition, the transistors 7_0 to 7_2 are connected to a signal line VUX, and controlled by signals WLUS_0 to WLUS_2 input to the gates thereof.

The signal lines WLDV_0 to WLDV_2 are each one of address signal lines. A selected one of the signal lines WLDV_0 to WLDV_2 is applied with a selected word line voltage from the row control circuit 12. The signal line VUX is a signal line that controls the potential applied to unselected word lines.

Reading a plurality of memory cells MC along one word line WL concurrently as described above leads to improved reading speed. In addition, it is preferable to select a plurality of memory cells, rather than a single memory cell, in a single memory block because a reverse bias leakage current may be reduced in the unselected memory cells.

However, if a read operation is performed by selecting a plurality of memory cells concurrently, it is likely, for example, that the potential of a word line WL that should be fixed to a certain potential would change as the number of the memory cells MC increases (which leads to increase in IR drop on the selected word line WL). This would result in a reduced margin for an accurate read operation of data retained in a memory cell MC.

Figure 3A:
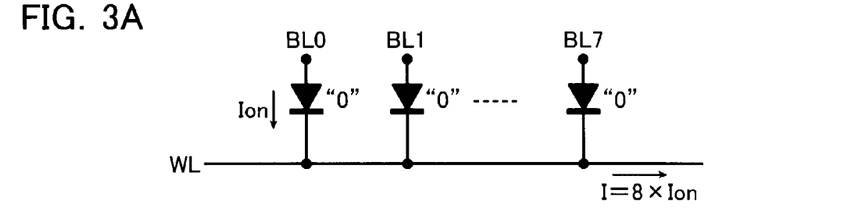
FIG. 3 is a conceptual diagram describing a problem that arises when a plurality of memory cells MC along one word line WL are read concurrently.
Figure 3B:
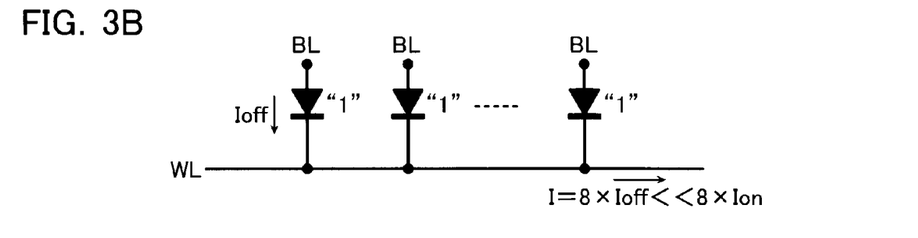

This problem will be described in detail below with reference to FIG. 3. For example, consider a case where eight memory cells MC along one word lines WL are to be read concurrently, and the eight memory cells MC are all "0" cells retaining "0" data of low resistance state (FIG. 3A). On the other hand, consider a case where these eight memory cells MC are all "1" cells retaining "1" data of high resistance state (FIG. 3B).

In the former case, if a current allowed to flow through one "0" cell is Ion, then a current I flowing through a word line WL is I=8×Ion. In the latter case, however, a current I flowing through the word line WL is 8×Ioff, which can be a very small current value depending on the resistance values of memory elements.

Although not illustrated, the word lines have a resistance value of on the order of several to tens of kΩ. Thus, such a difference in current leads to a difference in potential of the word lines. Here, in order to correctly read a "0" memory cell that has a low resistance state but has a relatively higher resistance value than normal "0" cells, it is necessary to raise the voltage of the bit line. This is because there is a case where the potential of the word line is increased by the other memory cells as illustrated in FIG. 3A. Without increasing the voltage of the bit line, such the "0" cell cannot be read as a "0" cell.

On the other hand, if the potential of the bit line is set sufficiently high, an excessive large cell current may flow if only one cell is in its low resistance state on the same word line WL. Alternatively, it leads to situations where a memory cell in a high resistance state having a relatively lower resistance may flow a current close to the current Ion.

In the former case, the margin for erroneous reset becomes small as the cell current becomes large, which raises concern about read disturb. In addition, in the latter case, the possibility of erroneous read where a "1" cell in a high resistance state appears as a "0" cell increases.

Accordingly, in a normal read operation, the operation setting should be optimized so that a certain performance level is achieved in consideration of such margins. As described below, however, in a memory system where ROM fuse data is stored in a memory cell, even higher reliability may be required for the read data. As used herein, the term "ROM fuse data" refers to initial setting data in a memory system including, for example, voltage setting or trimming data and failure or spare bit line/word line address data. If ROM fuse data is stored in the same memory cell as normal data, and if it is read immediately after power on, then it is required to perform a read operation in an even more accurate manner to read this data, as compared with a read operation to read normal data. Note that while ROM fuse data is stored in a memory cell having the same shape as that stores normal data, the circuit design is adapted so that access to this memory cell is performed through a dedicated internal address and cannot be specified from the outside.

The semiconductor storage device of this embodiment reduces the likelihood of erroneous read when performing a concurrent read operation on a plurality of memory cells by providing control as described below.

Figure 4:
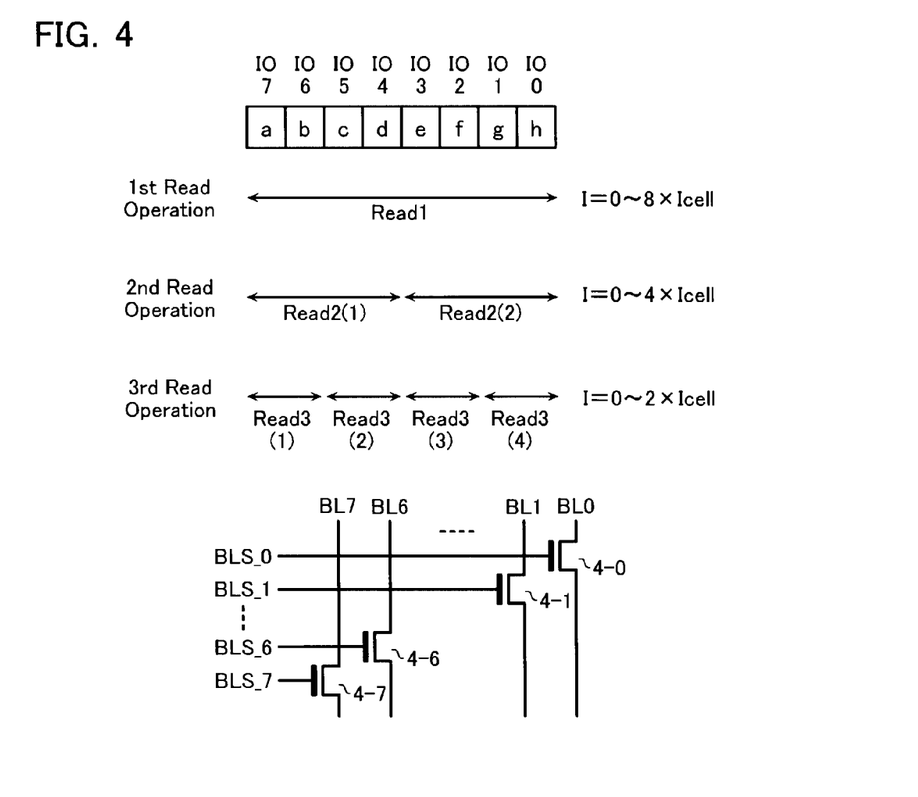
FIG. 4 is a conceptual diagram illustrating an overview of a data read operation of the semiconductor storage device according to the first embodiment.

FIG. 4 is a schematic diagram illustrating an overview of a data read operation of the semiconductor storage device according to this embodiment. In this embodiment, as illustrated in FIG. 4, data of one column (a to h) is read through input/output data lines I/O0 to I/O7. At this point, the controller 10 controls the column control circuit 13 to be operative to perform multiple different (in this case, three different, first to third read operations) read operations. The first to third read operations each involve a different number of bit lines BL to be read concurrently in one column.

Once a read execution command is input, the column control circuit 13 initially performs the first read operation. That is, the column control circuit 13 selects one column from a memory block BLK and provides the read voltage V_read to all of the (eight) bit lines in the one column (i.e., turning on the transistors 4-1 to 4-7 (FIG. 2)). The selected word line WL is provided with 0 V by the row control circuit 12. As a result, data is read concurrently from all of the bit lines BL in the one column. This is preferable in terms of improved reading speed as long as data is read in an accurate manner. However, as mentioned earlier, a current flowing through a word line WL fluctuates strongly (I=0 to 8×Icell) and erroneous read will be more likely to occur. If any erroneous read is detected based on the data check control circuit 6, then the second read operation is performed instead of the first read operation.

The second read operation performs a read operation from one column in two steps. During a read operation (Read2(1)) in the first step, the read voltage V_read is only applied to bit lines BL4 to BL7 in the selected one column, while 0 V is applied to the remaining bit lines BL0 to BL3. That is, a concurrent read operation is performed on only half the bit lines BL in the one column. After completion of the first read operation Read2(1), in the second read operation Read2(2), the read voltage V_read is only provided to the bit lines BL0 to BL3 in the selected one column, while 0 V is applied to the remaining bit lines BL4 to BL7 (already read).

In this way, the second read operation involves two read operations Read2(1) and Read2(2) to be performed separately in time. The resulting reading speed is half or less than the reading speed of the first read operation. However, the fluctuation range of the current flowing through the selected word line WL is also reduced by half, and hence erroneous read will be less likely to occur.

If any erroneous read still occurs in the second read operation, the process transitions to the third read operation. The third read operation performs a read operation from one column in four steps. During the first read operation (Read3(1)), the read voltage V_read is only provided to the bit lines BL6 to BL7 in the selected one column, while 0 V is applied to the remaining bit lines BL0 to BL5. During the subsequent second to fourth read operations (Read3(1) to (3)), read operations are performed so that the read voltage is only applied to two bit lines and 0 V to the other six bit lines, respectively.

In this way, the third read operation involves four read operations Read3(1) to (4) per column to be performed separately in time. The resulting reading speed is ¼ or less than the reading speed of the first read operation. However, the fluctuation range of the current flowing through the selected word line WL is further reduced.

Figure 5:
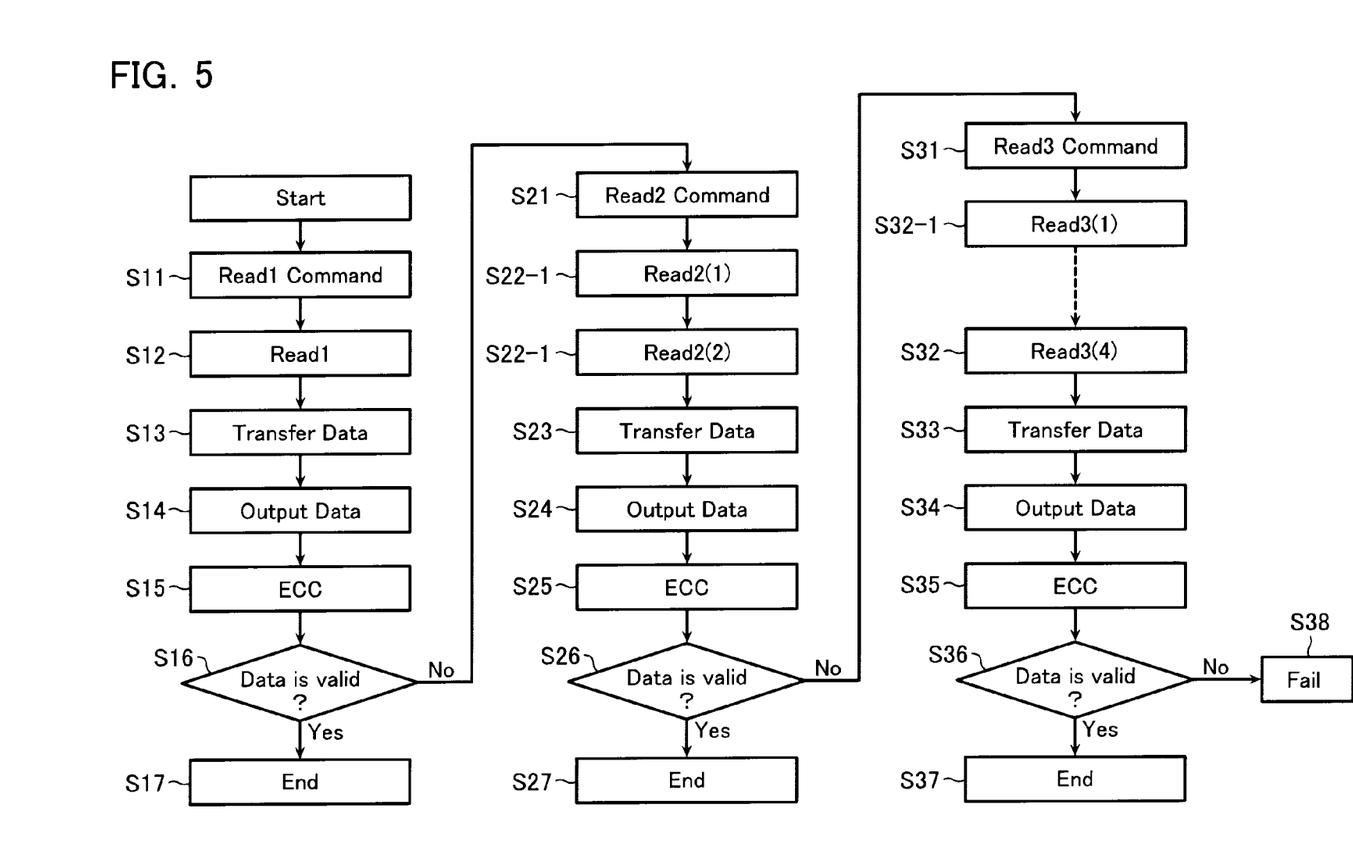
FIG. 5 is a flowchart illustrating a specific flow of read operations according to the first embodiment.

FIG. 5 is a flowchart illustrating a specific flow of read operations according to the first embodiment. In FIG. 5, steps S11 through S17 correspond to the above-mentioned first read operation, steps S21 through S27 to the second read operation, and steps S31 through 37 to the third read operation.

Upon output of a command to order execution of the first read operation (Read1 Command) (S11), the first read operation is initiated (S12). Then, data read by the sense amplifier circuit SA are transferred via the latch circuit LT over the data line DA to the page buffer 2, which in turn stores the data (S13). Subsequently, the data stored in the page buffer 2 are sequentially output to the output data buffer 14 (S14), and are subject to error detection/correction at the data check control circuit 6 using an ECC code, and so on (S15). As a result, if it is determined that the amount of errors is beyond an acceptable amount (errors cannot be corrected with an ECC code) and that the read data cannot be considered valid ("No" out of S16), then the process transitions to the second read operation. Steps S21 to S27 are similar to the first read operation, except that two-step read operations Read2(1) and (2) are performed (S22-1, S22-2).

If the read data in the second read operation is also determined not to be valid ("No" out of S26), then the process transitions to the third read operation. Steps S31 to S37 are similar to the first read operation, except that four-step read operations Read3(1) to (4) are performed (S32-1 to 4). If the read data in the third read operation is still determined not to be valid ("No" out of S36), then "Fail" is determined and the memory block BLK is taken as a defective block. Instead of determining "Fail", it is also possible to store the same data in another column in advance and to iterate similar read operations by accessing the other column. Meanwhile, if data is correctly read by the second and third read operations, the controller 10 may also be configured to move that data to another memory cell (the one with higher reliability) and perform read operations on that memory cell for further accessing thereto. It is expected that this may reduce reading times during the subsequent read operations.

[Second Embodiment]

Figure 6:
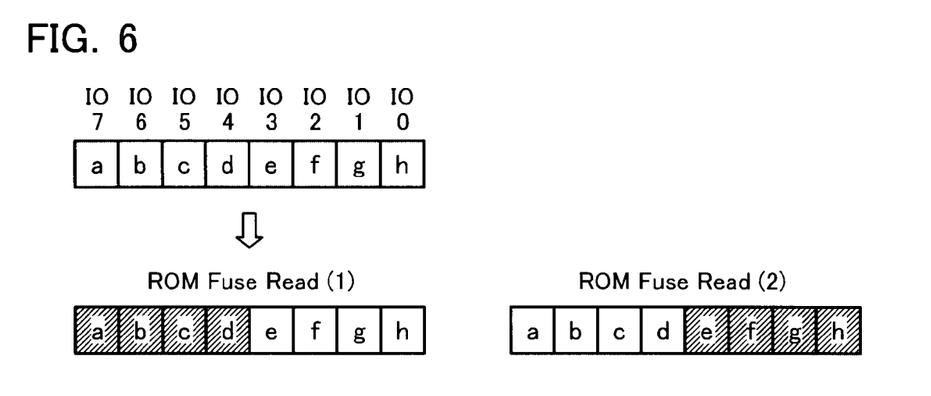
FIG. 6 is a conceptual diagram describing a procedure for reading ROM fuse data according to a second embodiment.
Figure 7:
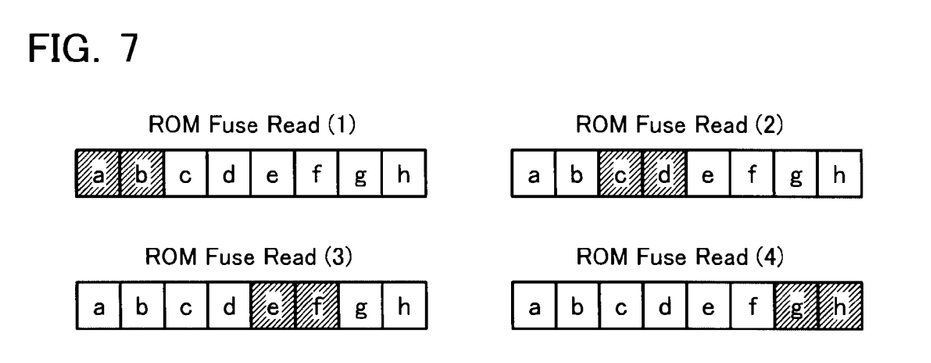
FIG. 7 is a conceptual diagram describing a procedure for reading ROM fuse data according to the second embodiment.
Figure 8:
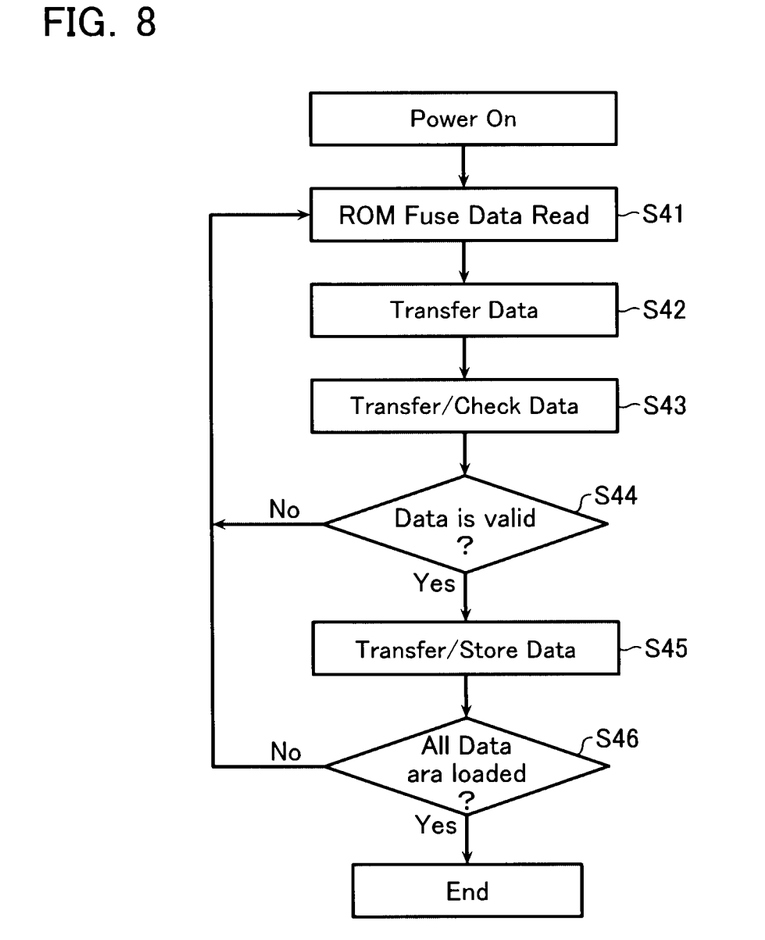
FIG. 8 is a conceptual diagram describing a specific procedure for reading ROM fuse data according to the second embodiment.

Referring now to FIGS. 6 to 8, the non-volatile semiconductor storage device according to a second embodiment will be described below. The device configuration is similar to that of the first embodiment (FIGS. 1 and 2), and description thereof will be omitted. The procedure for reading normal data is also substantially the same as that described in the first embodiment. This embodiment is different from the first embodiment in the way of reading initial setting data (ROM fuse data).

FIG. 6 is a conceptual diagram describing a procedure for reading ROM fuse data according to this embodiment. When ROM fuse data (a to h) of one column is read through the input/output data lines I/O0 to I/O7, the controller 10 performs a read operation corresponding to the second read operation of FIG. 4 from the beginning of the read operation, without performing a read operation corresponding to the first read operation of FIG. 4 (Read1 of FIG. 4). That is, as illustrated in FIG. 6, a read operation of ROM fuse data from one column is performed in two steps (4 bits per step) from the beginning of the read operation. During the first read operation (ROM Fuse Read(1)) of the two steps, the read voltage V_read is only applied to the bit lines BL4 to BL7 in the selected one column, while 0 V is applied to the remaining bit lines BL0 to BL3. This means that a concurrent read operation is performed on only half four bit lines BL in the one column. After completion of the first read operation ROM Fuse Read(1), in the second read operation ROM Fuse Read(2), the read voltage V_read is only provided to the bit lines BL0 to BL3 in the selected one column, while 0 V is applied to the remaining bit lines BL4 to BL7 (already read during the first read operation ROM Fuse Read(1)).

In this way, the read operation of ROM fuse data involves two read operations Read2(1) and Read2(2) to be performed separately in time from the beginning. The resulting reading speed is half or less than the reading speed of the second read operation. However, the fluctuation range of the current flowing through the selected word line WL is also reduced by half, and hence erroneous read will be less likely to occur. Since the ROM fuse data is important information for defining the memory operation, it requires a read operation to be performed in an even more accurate manner. Additionally, it is desirable that the possibility of erroneous read is sufficiently reduced in operation. This is because the ROM fuse data is read under a condition where the power supply voltage is still unstable immediately after power on.

In addition, as illustrated in FIG. 7, a read operation of ROM fuse data from one column may be performed from the beginning of the read operation in a larger number of steps, e.g., four steps (2 bits per step) (ROM Fuse Read(1) to (4)). Alternatively, for example, it is possible to make an error determination after the two-step read operations are performed as illustrated in FIG. 6, and perform the four-step read operations of FIG. 7 according to the result of the determination.

Referring now to the flowchart of FIG. 8, a specific procedure for reading this ROM fuse data. Firstly, after power on, a trigger signal is output from the controller 10 to order initiation of a read operation of ROM fuse data. Then, ROM fuse data is read according to the reading scheme of FIG. 6 or 7, and the read signal is sensed and amplified at the sense amplifier circuit SA (step S41). The amplified signal is transferred as the read data from the sense amplifier circuit SA to the page buffer 2 (step S42). Then, the read data transferred to the page buffer 2 is further transferred to the data check control circuit 6 (step S43), where a determination is made as to whether it is correct or incorrect (step S44). If the read data has any error, the process returns to step S41 to perform the read operation again, changing the way of reading, and so on. If there is no error in the data, that data is transferred to and stored in the column/row redundancy register 7 and the parameter register 8 (step S45). From then on, similar operations are iterated until all ROM fuse data is stored (S46).

[Third Embodiment]

Figure 9:
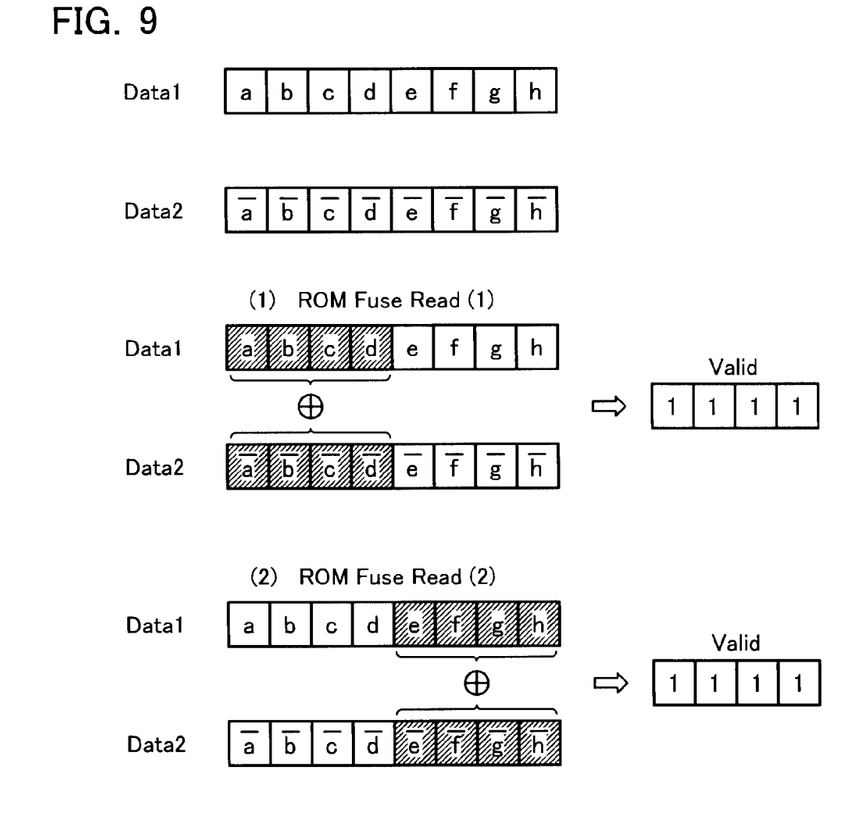
FIG. 9 is a conceptual diagram describing a procedure for reading ROM fuse data according to a third embodiment.
Figure 10:
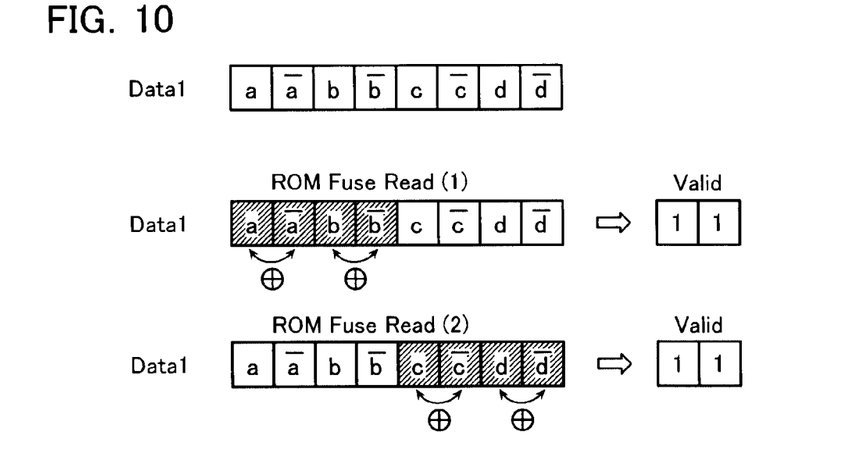
FIG. 10 is a conceptual diagram describing a procedure for reading ROM fuse data according to the third embodiment.
Figure 11:
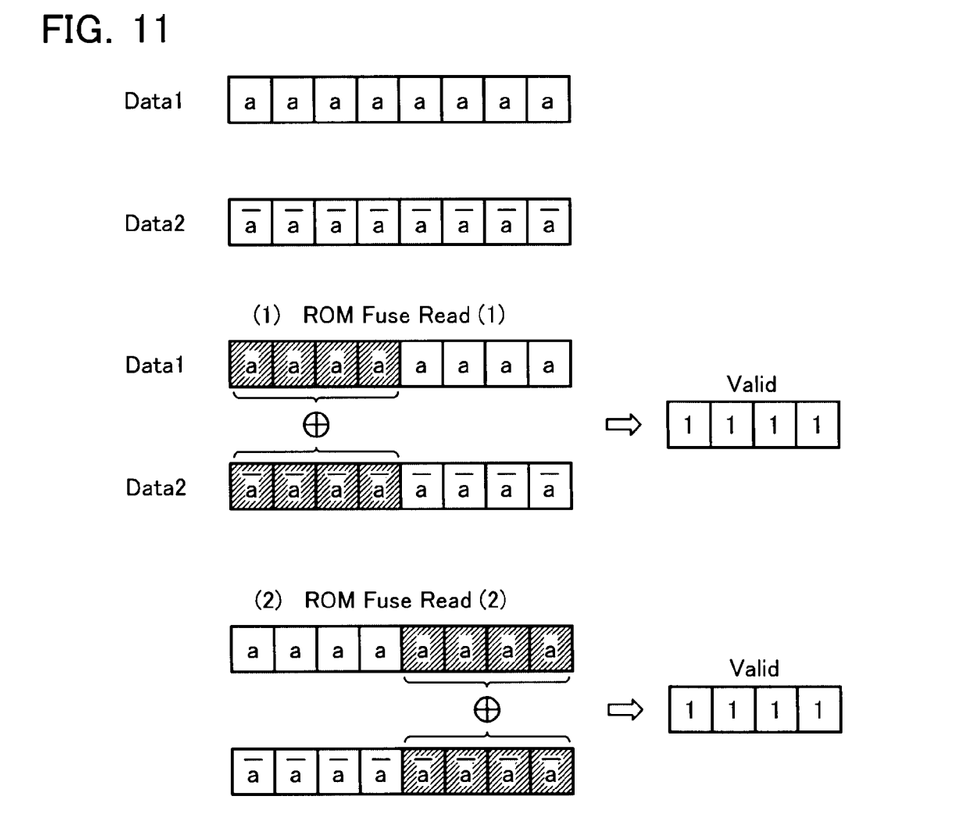
FIG. 11 is a conceptual diagram describing a procedure for reading ROM fuse data according to the third embodiment.

Referring now to FIGS. 9 to 11, the non-volatile semiconductor storage device according to a third embodiment will be described below. The device configuration is similar to that of the first embodiment (FIGS. 1 and 2), and description thereof will be omitted. The procedure for reading normal data is also substantially the same as that described in the first embodiment. This embodiment is different from the second embodiment in the form of storing initial setting data (ROM fuse data) and in the way of reading ROM fuse data.

In this embodiment, not only ROM fuse data Data1 (a to h), but also the complementary data Data2 (/a to /h) are stored as illustrated in FIG. 9. Then, the data Data1 and Data2 are read concurrently. Furthermore, an exclusive OR operation between these data is performed at the data check control circuit 6 to determine whether the ROM fuse data is correct or incorrect. As is the case with the second embodiment (FIG. 6), ROM fuse data of one column is also read in two steps (ROM Fuse Read(1) and (2)). It is also possible to make a determination with a logical operation other than an exclusive OR operation.

FIGS. 10 and 11 illustrate variations of the third embodiment. In FIG. 10, ROM fuse data Data1 of one column stores 4 bits of data a, b, c, d, as well as 4 bits of data /a, /b, /c, /d representing the complementary data.

Then, in the first read operation ROM Fuse Read(1), 4 bits of data a, /a, b, /b are read from the bit lines BL4 to 7, on which data an exclusive OR operation is performed to determine whether the ROM fuse data is correct or incorrect. Similarly, in the second read operation ROM Fuse Read(2), 4 bits of data c, /c, d, /d are read from the bit lines BL0 to 3, on which data an exclusive OR operation is performed to determine whether the ROM fuse data is correct or incorrect.

FIG. 11 includes, similar to FIG. 9, ROM fuse data Data1 of one column and the complementary data Data2 of the data Data1. However, the ROM fuse data Data1 has the same data a stored in all of 8 bits, and ROM fuse data Data2 has all the same data stored in all bits. The reading procedure is substantially the same as that illustrated in FIG. 9.

Figure 12:
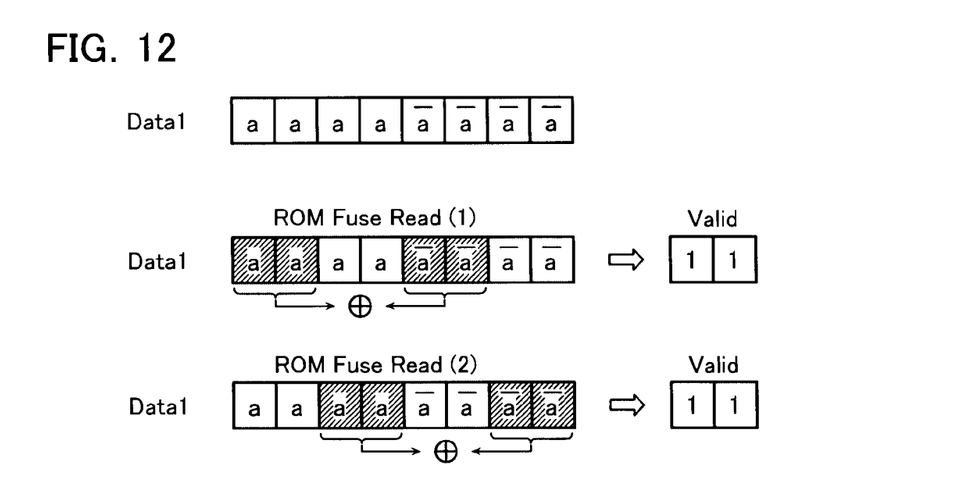
FIG. 12 is a conceptual diagram describing a procedure for reading ROM fuse data according to the third embodiment.

FIG. 12 illustrates that a half (4 bits) of ROM fuse data Data1 of one column has data a and the other half has data /a, where an exclusive OR operation is performed between the two halves. FIG. 12 illustrates a case where the first read operation ROM Fuse Read(1) reads data from the memory cells along the bit lines BL7, BL6, BL3, BL2 to perform an exclusive OR operation therebetween, followed by the second read operation ROM Fuse Read(2) reading data from the memory cells along the remaining bit lines to perform an exclusive OR operation therebetween. Alternatively, it is possible to perform a read operation in four times in units of two bit lines.

Figure 13:
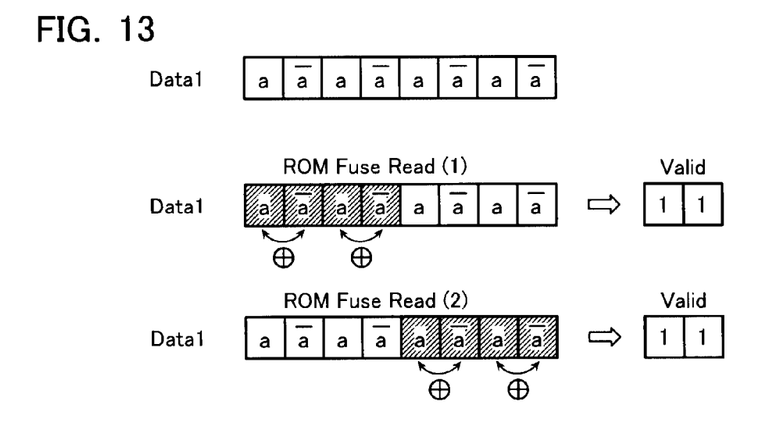
FIG. 13 is a conceptual diagram describing a procedure for reading ROM fuse data according to the third embodiment.

FIG. 13 illustrates a case where ROM fuse data of one column stores alterations of data a and the complementary data /a. Again, the first read operation (ROM Fuse Read(1)) may select the bit lines BL4 to BL7 in the selected one column, and the second read operation ROM Fuse Read(2) may select the bit lines BL0 to BL3 in the selected one column. Then, an exclusive OR operation may be performed in each of the read operations.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 14A:
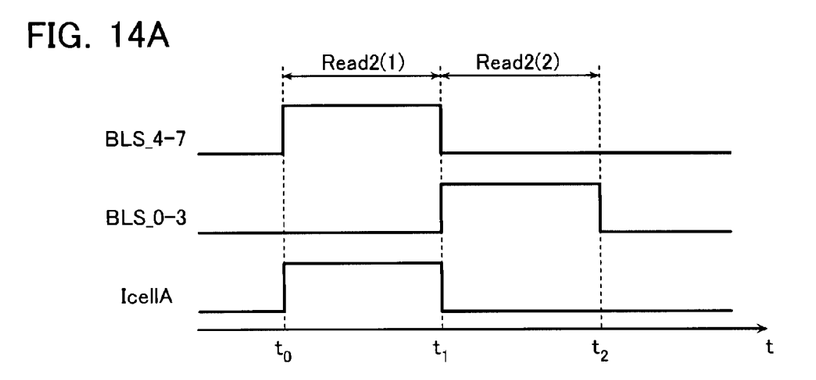
FIGS. 14A and 14B are each a conceptual diagram illustrating a variation of the embodiments.

For example, in the above-described embodiments, it is also possible to prevent a read operation Read2(1) in the first step and a read operation Read2(2) in the second step from overlapping each other in time. As an example, this can be achieved by, as illustrated in FIG. 14A, performing the read operation Read2(1) in the first step with signals BLS_4 through BLS_7 raised "H" only between times t0 and t1, and subsequently performing the read operation Read2(2) in the second step with signals BLS_0 through BLS_3 raised "H" between the following times t1 and t2, and so on. By avoiding overlaps in time, potential floating in a word line WL can be suppressed. The control scheme as illustrated in FIG. 14A is desirable in terms of suppression of erroneous read.

Figure 14B:
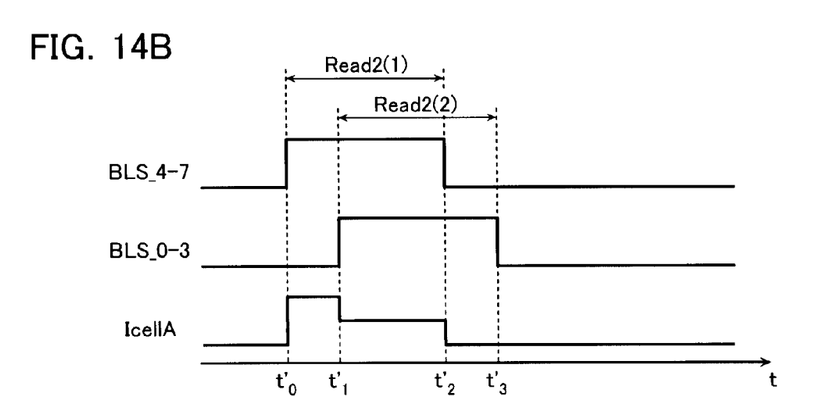

Alternatively, however, as illustrated in FIG. 14B, the signals BLS may also be controlled so that the read operation Read2(1) in the first step and the read operation Read2(2) in the second step partially overlap each other in time. That is, the signals BLS_0 to 3 may be raised "H" at time t1' after time t0' when the signals BLS_4 to 7 are raised "H" and before time t2' when they are pulled "L". Provision of such control allows a reading time to be reduced by a overlapping period. Conversely, however, if the overlapping period is too long, the possibility of erroneous read increases. This means that if the overlapping period is set long, and if there are many cells in a low resistance state in a memory cell MC on which the read operation Read2(1) in the first step is to be performed, then potential floating occurs in a word line WL and the cell current IcellA significantly decreases after time t1'. This makes accurate determination of data difficult. The proper setting of time t1' may achieve reductions in both reading time and possibility of erroneous read.

What is claimed is:

1. A method of reading a semiconductor storage device comprising memory cells arranged at respective intersections between a plurality of first wirings and a plurality of second wirings, each of the memory cells including a rectifier element and a variable resistance element connected in series, the method comprising:
performing a first concurrent read operation on M of the first wirings (where M is a natural number); and
performing a second concurrent read operation on N of the first wirings (where N<M, N is a natural number) according to a result of a determination of the first concurrent read operation.

2. The method of reading according to claim 1, wherein N is a number equal to one half of M, and
the second concurrent read operation involves two read operations to be performed separately in time.

3. The method of reading according to claim 1, wherein error correction is performed on read data in the first concurrent read operation, and execution of the second concurrent read operation is begun according to a result of the error correction.

4. The method of reading according to claim 3, wherein N is a number equal to one half of M, and
the second concurrent read operation involves two read operations to be performed separately in time.

5. The method of reading according to claim 1, wherein a smaller number of the first wirings are applied with a voltage concurrently when a concurrent read operation is performed with respect to initial setting data, as compared with when normal data is read with the concurrent read operation.

6. The method of reading according to claim 5, wherein the initial setting data includes first data and second data, the second data representing the complementary data of the first data, and
a determination is made as to whether the initial setting data is read correctly or incorrectly based on a logical operation between the first data and the second data.

7. A semiconductor storage device comprising:
a memory cell array including memory cells arranged at respective intersections between a plurality of first wirings and a plurality of second wirings, each of the memory cells including a rectifier element and a variable resistance element connected in series; and
a control circuit configured to apply a first voltage to a selected one of the first wirings and a second voltage lower than the first voltage to a selected one of the second wirings so that a certain potential difference is applied to a selected memory cell positioned at an intersection between the selected first wiring and the selected second wiring, and
the control circuit being configured to be able to perform a concurrent read operation to perform a read operation from a plurality of the memory cells concurrently by applying the first voltage to a plurality of the first wirings concurrently, and being configured to be able to switch the number of the first wirings to be applied with the first voltage concurrently in the concurrent read operation, wherein
the control circuit is configured to be able to perform a first concurrent read operation on M of the first wirings (where M is a natural number), then determine whether a result of the read operation is correct or not, and perform a second concurrent read operation on N of the first wirings (where N<M, N is a natural number) according to a result of the.

8. The semiconductor storage device according to claim 7, wherein
the control circuit is configured to apply the first voltage concurrently to a smaller number of the first wirings when performing the concurrent read operation with respect to initial setting data, as compared with when reading normal data with the concurrent read operation.

9. The semiconductor storage device according to claim 8, wherein
the initial setting data includes first data and second data, the second data representing the complementary data of the first data, and
the control circuit is configured to determine whether the initial setting data is read correctly or incorrectly based on a logical operation between the first data and the second data.

10. The semiconductor storage device according to claim 7, wherein
N is a number equal to one half of M, and
the second concurrent read operation involves two read operations to be performed separately in time.

11. The semiconductor storage device according to claim 7, wherein
the control circuit is configured to perform error correction on read data in the first concurrent read operation, and begin to execute the second concurrent read operation according to a result of the error correction.

12. The semiconductor storage device according to claim 11, wherein

N is a number equal to one half of M, and the second concurrent read operation involves two read operations to be performed separately in time.

13. The semiconductor storage device according to claim 7, wherein the control circuit is configured to apply the first voltage concurrently to a smaller number of the first wirings when performing the concurrent read operation with respect to initial setting data, as compared with when reading normal data with the concurrent read operation.

14. The semiconductor storage device according to claim 13, wherein the initial setting data includes first data and second data, the second data representing the complementary data of the first data, and the control circuit is configured to determine whether the initial setting data is read correctly or incorrectly based on a logical operation between the first data and the second data.

15. The semiconductor storage device according to claim 13, wherein multiple bits of data that are read by a unit of read in the concurrent read operation include the same data.

16. The semiconductor storage device according to claim 15, wherein

N is a number equal to one half of M, and the second concurrent read operation involves two read operations to be performed separately in time.

17. The semiconductor storage device according to claim 15, wherein the control circuit is configured to perform error correction on read data in the first concurrent read operation, and begin to perform the second concurrent read operation according to a result of the error correction.

18. The semiconductor storage device according to claim 1, wherein the second concurrent read operation involves a first read operation and a second read operation initiated before completion of the first read operation.

19. The semiconductor storage device according to claim 7, wherein multiple bits of data that are read by a unit of read in the concurrent read operation include the same data.

* * * * *